US010892258B2

(12) United States Patent
Grad et al.

(10) Patent No.: US 10,892,258 B2
(45) Date of Patent: Jan. 12, 2021

(54) ESD-ROBUST STACKED DRIVER

(71) Applicant: NXP B.V., Eindhoven (NL)

(72) Inventors: Marcin Grad, Bemmel (NL); Paul H. Cappon, Wijchen (NL); Taede Smedes, Beuningen (NL)

(73) Assignee: NXP B.V., Eindhoven (NL)

( * ) Notice: Subject to any disclaimer, the term of this patent is extended or adjusted under 35 U.S.C. 154(b) by 212 days.

(21) Appl. No.: 16/239,801

(22) Filed: Jan. 4, 2019

(65) Prior Publication Data

US 2020/0219867 A1    Jul. 9, 2020

(51) Int. Cl.
*H01L 27/02*        (2006.01)
*H04L 25/02*        (2006.01)

(52) U.S. Cl.
CPC ...... *H01L 27/0266* (2013.01); *H01L 27/0255* (2013.01); *H01L 27/0259* (2013.01); *H04L 25/0272* (2013.01)

(58) Field of Classification Search
CPC ......... H01L 21/28052; H01L 21/28097; H01L 21/28518; H01L 21/8228; H01L 21/8232; H01L 21/845; H01L 23/60; H01L 23/62; H01L 27/0214; H01L 27/0248; H01L 27/0255; H01L 27/0259; H01L 27/0266; H01L 27/0285; H01L 27/0617;
(Continued)

(56) References Cited

U.S. PATENT DOCUMENTS 6,140,682 A * 10/2000 Liu ............. H01L 27/0266
257/355
2004/0041215 A1 * 3/2004 Chaine ............ H01L 29/7831
257/401
(Continued)

FOREIGN PATENT DOCUMENTS

TW           1228312 B      2/2005

OTHER PUBLICATIONS

Warren R. Anderson et al., ESD Protection for Mixed-Voltage I/O Using NMOS Transistors Stacked in Cascode Configuration, Electrical Overstress/Electrostatic Discharge Symposium (EOS/ESD), Oct. 6-8, 1998.
(Continued)

*Primary Examiner* — Jared Fureman
*Assistant Examiner* — Nicolas Bellido

(57) ABSTRACT

An integrated "pull-down" driver circuit (210) is formed with a combination device consisting of an output driver transistor (N1) electrically coupled between a current source circuit (Ns) and the conductive pad, and an ESD bypass transistor (N3) electrically coupled in series with the output driver transistor, where one or more conductive interconnect layers connect the ESD bypass transistor in parallel with the current source circuit so that the ESD bypass transistor is in an off-state during normal operation and is activated to form a parasitic bipolar junction transistor with the output driver transistor to conduct ESD current between a first power supply conductor and the conductive pad during ESD events, and where a complementary integrated "pull-up" driver circuit may be formed with three corresponding PMOS transistors (P1, $P_S$, P3) connected as shown between a second power supply conductor and the conductive pad.

20 Claims, 4 Drawing Sheets

Fig. 5

(58) Field of Classification Search
CPC .............. H01L 27/0647; H01L 27/0682; H01L 27/0705; H01L 27/0794; H01L 27/082; H01L 27/085; H01L 27/098; H01L 27/101; H01L 27/105; H01L 27/11803; H01L 27/1211; H01L 27/14679; H01L 27/228; H01L 27/2454; H01L 27/283; H01L 29/0843; H01L 29/1075; H01L 29/41725; H01L 29/42312; H01L 29/432; H01L 29/66045; H01L 29/66325; H01L 29/665; H01L 29/66893; H01L 29/7392; H01L 29/745; H01L 29/749; H01L 29/76; H01L 29/7815; H01L 29/7826; H01L 2924/00; H01L 2924/0002; H01L 2924/1306; H01L 31/112; H02H 3/22; H02H 9/046; H03K 19/00315; H04L 25/0272; H05K 1/0259
USPC .......... 361/56; 257/213, 272, 274, 355, 360, 257/384, 517, 525, 526, 533, 556
See application file for complete search history.

(56) References Cited

U.S. PATENT DOCUMENTS

| | | | |
|---|---|---|---|
| 2010/0231266 A1 | 9/2010 | Kishor | |
| 2011/0032648 A1 | 2/2011 | Darthenay et al. | |
| 2013/0114169 A1* | 5/2013 | Werner | H05B 45/50 361/56 |
| 2014/0159206 A1* | 6/2014 | Hsu | H01L 27/0259 257/565 |
| 2017/0012037 A1* | 1/2017 | De Raad | H01L 27/0262 |
| 2018/0145065 A1* | 5/2018 | Holland | H01L 29/41758 |

OTHER PUBLICATIONS

Teruo Suzuki et al., A Study of ESD Robustness of Cascoded NMOS Driver, 29th Electrical Overstress/Electrostatic Discharge Symposium (EOS/ESD), Sep. 16-21, 2007.

* cited by examiner

ESD-ROBUST STACKED DRIVER

BACKGROUND OF THE INVENTION

Field of the Invention

The present invention is directed in general to electrostatic discharge (ESD) protection. In one aspect, the present invention relates to integrated circuit electrostatic discharge (ESD) protection devices and methods for operating same.

Description of the Related Art

An integrated circuit (IC) may be subject to an ESD event in the manufacturing process, during assembly and testing, or in the system application. Some on-chip ESD primary protection networks use an active MOSFET (metal oxide semiconductor field-effect transistor) rail clamp protection scheme with large ESD diodes between the input/output (I/O) pads and the power supply rails. Other approaches, using different types of rail clamps, may also be used. Protecting against such ESD events is especially important with integrated circuits which use thin gate oxide (e.g., 1.2V) input/output (I/O) drivers that may be connected in a stacked arrangement (e.g., connected to current sources from supply and ground side) to an I/O pad. In particular, thin oxide devices, while chosen for functional reasons (e.g., speed, bandwidth), are susceptible to ESD events having high charge device model (CDM) currents (e.g., >12 A at 500V discharge). While conventional approaches for providing ESD protection use thick oxide devices as an RC-triggered supply ESD protection to minimize leakage in combination with ESD diodes from I/O to supply and from ground to I/O, such approaches can result in damage to the gate oxide of the driver transistors due to excessive drain-gate voltage overshoots resulting from the finite response time of the supply protection trigger in combination with the turn-on time of the ESD diodes. Existing solutions to address this shortcoming, such as using thin oxide RC-triggered supply protection or placing the driver behind a secondary protection, are not always acceptable due to the additional complexity, cost, control signal requirements, and performance limitations, such as current leakage from the thin oxide supply protections, as well as increases in series resistor and capacitance from the secondary protection. As seen from the foregoing, the existing ESD protection schemes for stacked output drivers are extremely difficult at a practical level by virtue of the challenges with balancing the competing considerations of design efficiency, cost, performance, and ESD protection.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

An electrostatic discharge (ESD) protection device and associated methods of operation are described for protecting I/O pads of an integrated circuit, where the ESD protection device includes a driver circuit of stacked driver transistors connected between functional (e.g., current source) transistors with normally-off ESD discharge transistors connected behind each I/O-facing driver transistor in the driver circuit which has a drain connected to an I/O pad, thereby providing an ESD current discharge path from the drain of the I/O-facing driver transistor to ground (or supply). In selected embodiments where the drain of the normally-off ESD discharge transistor is connected to the source of the I/O-facing driver transistor and where the gate of the normally-off ESD discharge transistor is connected via a pull-up/down device (e.g., a resistor) to ground (or supply), the driver circuit is able to activate the normally-off ESD discharge transistor during ESD events to sink some ESD current that is generated before the primary ESD protection kicks in, thereby making the driver more robust to ESD stress. In other embodiments, the normally-off ESD discharge transistors are formed as thin oxide transistors in series with the I/O-facing driver transistor as a stacked, single diffusion ESD device, thereby forming a parasitic bipolar transistor directly between the I/O and ground that sinks at least part of the ESD current. Once triggered, the parasitic bipolar transistor will protect the circuit underneath and will limit the gate-drain voltage of the I/O-facing driver transistor. To create effective common bipolar transistors from the I/O, the layout of the facing transistor and normally-off transistors should be controlled to have equal gate width dimensions. And to ensure that bipolar triggering current does not damage the stacked, single diffusion ESD device, resistance implants and/or silicide blocking may be added to the drain of the I/O-facing transistor (and to the drain of normally-off ESD device) to reduce ESD current flow. As disclosed herein, any stack of MOSFET transistors connected to an I/O pad may be protected against ESD events by adding an ESD protection device as a transistor that is connected between the first I/O-facing transistor in the stack and the ground/supply (for pull-down/pull-up, respectively) so as to be OFF during normal operation and to provide an current discharge path during ESD events. If the dimensions of the driver and ESD protection device are large enough, this could even lead to a fully self-protecting structure so that no additional ESD diodes are needed.

Figure 1:
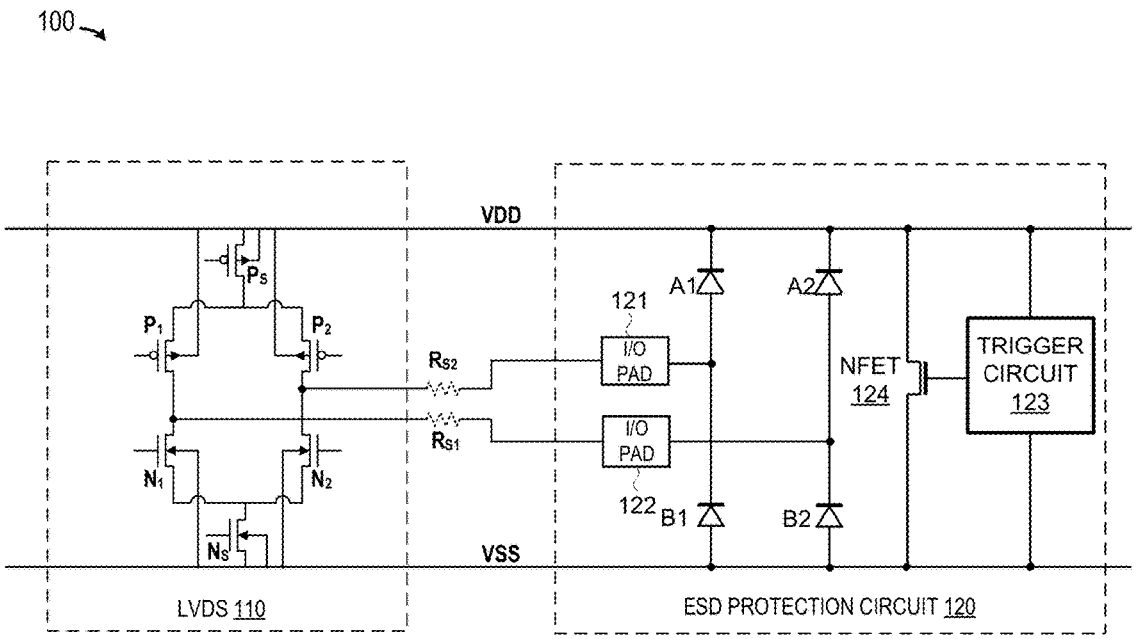
FIG. 1 illustrates a simplified circuit schematic diagram of a cascoded I/O driver circuit employing a conventional ESD protection circuit.

To provide additional details for an improved contextual understanding of the present disclosure, reference is now made to FIG. 1 which depicts simplified circuit schematic diagram 100 of a cascoded I/O driver circuit 110 employing a conventional ESD protection circuit 120 for protecting one or more I/O pads 121, 122. As illustrated, the cascoded I/O driver circuit 110 may be implemented as a low voltage differential signal (LDVS) circuit 110 which includes a PMOS current source transistor Ps connected to a first power supply VDD, an NMOS current source transistor Ns connected to a second power supply VSS, a first set of stacked driver transistors P1, N1 connected in series between the current source transistors Ps, Ns, and a second set of stacked driver transistors P2, N2 connected in series between the current source transistors Ps, Ns. Each of the depicted PMOS driver and current source transistors P1, P2, Ps have their substrates connected to the first power supply VDD, while depicted NMOS driver and current source transistors N1, N2, Ns have their substrates connected to the second power supply VSS. In response to gate controls signals, each set of stacked driver transistors is separately connected to drive one of the I/O pads 121, 122, either directly or over an optional corresponding series resistance $R_{S1}$, $R_{S2}$ (where the optional series resistance connection is indicated with dashed lines).

The depicted ESD protection circuit 120 is connected between the I/O pads, the first power supply VDD and second power supply VSS, and includes a rail clamp NFET device 124 having current electrodes coupled between the power supplies VDD, VSS and a control gate electrode connected to the trigger circuit 123. Though shown as an NMOS MOSFET transistor, the rail clamp device may be of a different type, for example, a PMOS transistor, a BJT (bipolar junction transistor), an SCR (silicon-controlled rectifier), or a GGMOS (grounded gate MOS) transistor. The depicted trigger circuit 123 is coupled between the supply voltages VDD, VSS to provide a trigger signal to the gate of the rail clamp NFET device 124. As will be appreciated, any suitable trigger circuit may be used. In addition, each I/O pad 121, 122 is connected over a first diode A1, A2 to the first power supply VDD, and is also connected over a second diode B1, B2 to the second power supply VSS. As will be appreciated, ESD diodes (e.g., A1, B1) may be sized for conducting a relatively large ESD current, where ESD diode A1 provides a high-current ESD path from the I/O pad 121 to VDD in case of a positive ESD event on the I/O pad 121, and ESD diode B1 provides a high-current ESD path from VSS to I/O pad 121 in case of a negative ESD event on the I/O pad 121. During an ESD event that requires shunting a high ESD current from VDD to the VSS by the rail clamp NFET device 124 (e.g., a positive ESD zap on I/O pad 121 with respect to another I/O pad), the trigger circuit 123 provides the voltage from first power supply VDD to the gate of rail clamp NFET device 124.

For example, in cases where a thick oxide transistor is used to minimize leakage for the rail clamp NFET device 124, there is a possibility that the gate oxide of the driver transistors (e.g., P1, N1) can be damaged due to excessive drain-gate voltage overshoots resulting from the finite response time of the supply protection trigger in combination with the turn-on time of the ESD diodes (e.g., A2, B2). Common solutions, such as using thin oxide RC-triggered supply protection are not always acceptable since they have high leakage. Other solutions which involve placing the driver behind a secondary protection can create series resistance and capacitance that limit performance.

Figure 2:
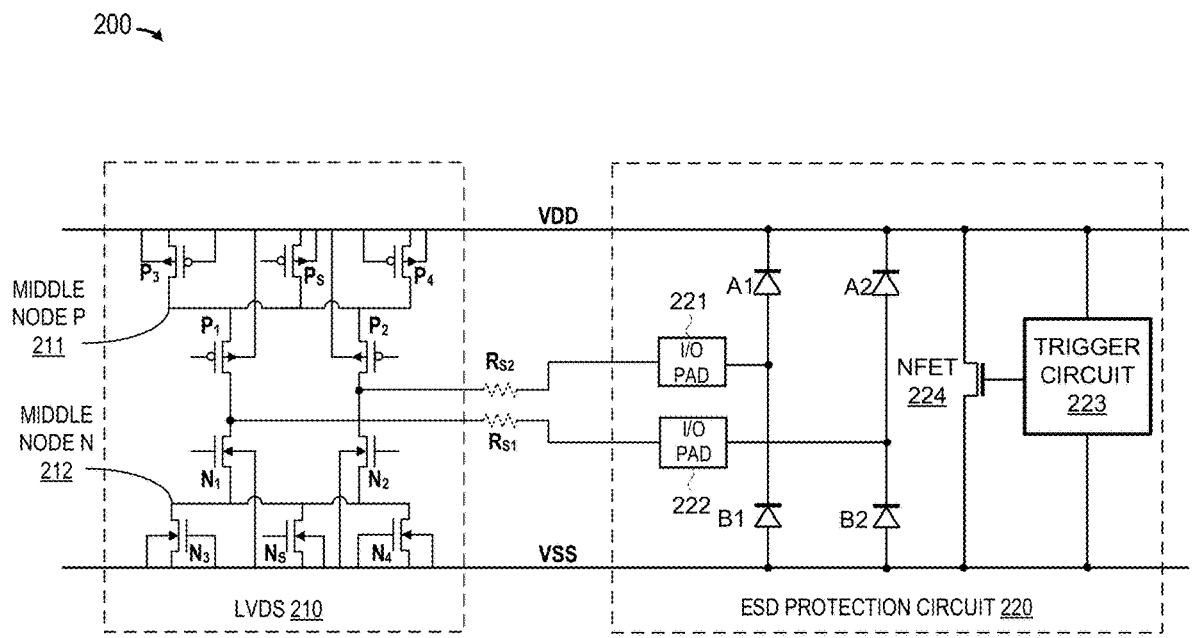
FIG. 2 illustrates a simplified circuit schematic diagram of an ESD-robust cascoded I/O driver circuit and ESD protection circuit in accordance with selected embodiments of the disclosure.

To address these design challenges and other limitations from conventional ESD protection solutions, reference is now made to FIG. 2 which illustrates a simplified circuit schematic diagram 200 of an ESD-robust cascoded I/O driver circuit 210 and ESD protection circuit 220 for protecting one or more I/O pads 221, 222 in accordance with selected embodiments of the disclosure. As illustrated, the ESD protection circuit 220 includes I/O pads 221, 222 which are connected, respectively between the ESD diode paths A1/B1, A2/B2 which are each connected between the power supplies VDD, VSS. In addition, the ESD protection circuit 220 includes a trigger circuit 223 and rail clamp FET device 224 (e.g., NFET, PFET, BJT, SCR, GGMOS, etc.) coupled between the power supplies VDD, VSS to provide RC-triggered supply protection. In operation, the ESD protection circuit 220 provides protection against large ESD events (e.g., high charged device model (CDM) currents), but such events can create overshoots on the I/O pads 221, 222 that exceed the gate oxide breakdown voltage of I/O-facing driver transistors in the driver circuit 210.

To protect against the ESD discharge currents, the illustrated driver circuit 210 may be implemented as a low voltage differential signal (LVDS) driver or other driver that includes a first set of I/O-facing PMOS ESD bypass transistors P3, P4 connected in parallel with the first circuit element (e.g., current source transistor Ps), and a second set of I/O-facing NMOS ESD bypass transistors N3, N4 connected in parallel with a second circuit element (e.g., current source transistor Ns). Though the ESD bypass transistors (P3, P4, N3, N4) are illustrated as dummy devices that have gate and source nodes connected to the corresponding power supply conductor, it will be appreciated that the source and/or gate nodes of the ESD bypass transistor may be coupled over a pull-up/down device to the corresponding power supply conductor. In particular, the LVDS driver includes first and second power supplies VDD, VSS connected, respectively, to the PMOS current source transistor Ps and the NMOS current source transistor Ns. In addition, the driver circuit 210 includes a first set of stacked driver transistors P1, N1 connected in series between the current source transistors Ps, Ns, and a second set of stacked driver transistors P2, N2 connected in series between the current source transistors Ps, Ns. Each of the depicted PMOS driver, current source, and ESD bypass transistors have their substrates connected to the first power supply VDD, while depicted NMOS driver, current source, and ESD bypass transistors have their substrates connected to the second power supply VSS. In response to gate controls signals, each set of stacked driver transistors P1, P2, N1, N2 is separately connected to drive one of the I/O pads 221, 222, either directly or indirectly over a corresponding series resistance $R_{S1}$, $R_{S2}$ (as indicated with dashed lines). However, with each ESD bypass transistor having its gate and source connected to its substrate and its drain connected to the source node of a corresponding I/O-facing driver transistor that is directly connected (or optionally indirectly connected through the series resistance $R_{S1}$, $R_{S2}$) to the I/O pad 221, 222, the ESD bypass transistors P3, P4, N3, N4 are "off-state" devices during normal operation, but can be operative in an ESD event to provide a current path from the drain of the I/O-facing driver transistor which can sink ESD current. In effect, each ESD bypass transistor P3, P4, N3, N4 is turned OFF during normal operation, but when turned ON in bipolar mode during an ESD event, the ESD bypass transistor effectively forms a common bipolar transistor from the I/O pad to ground (or I/O to supply in case of PMOS driver side) to bypass and protect the I/O-facing driver transistor by limiting its drain-gate voltage through the bipolar current flow which bypasses the I/O-facing transistor. At the same time, it prevents/reduces current flow through the channel of N1 and the current source Ns. In this way, the ESD bypass transistors (e.g., N3) protect not only the I/O-facing driver transistor (e.g., N1), but also protect the stacked driver transistors connected to the node just below I/O-facing driver transistor without any additional ESD precautions required. By providing an ESD current discharge path through the ESD bypass transistors P3, P4, N3, N4, the stacked output driver 210 is protected against ESD current discharges that arise before and while the ESD protection circuit 220 is activated, and may even be self-protecting during ESD events.

As disclosed herein, each I/O-facing driver transistor (e.g., N1) and the corresponding ESD bypass transistor (e.g., N3) should be designed to have a sufficient size to form a common bipolar junction transistor that is large enough to absorb the complete ESD current. In this case, the ESD diodes (e.g., A1, B1) in the ESD protection circuit 120 may be redundant and not required for ESD protection.

Figure 3:
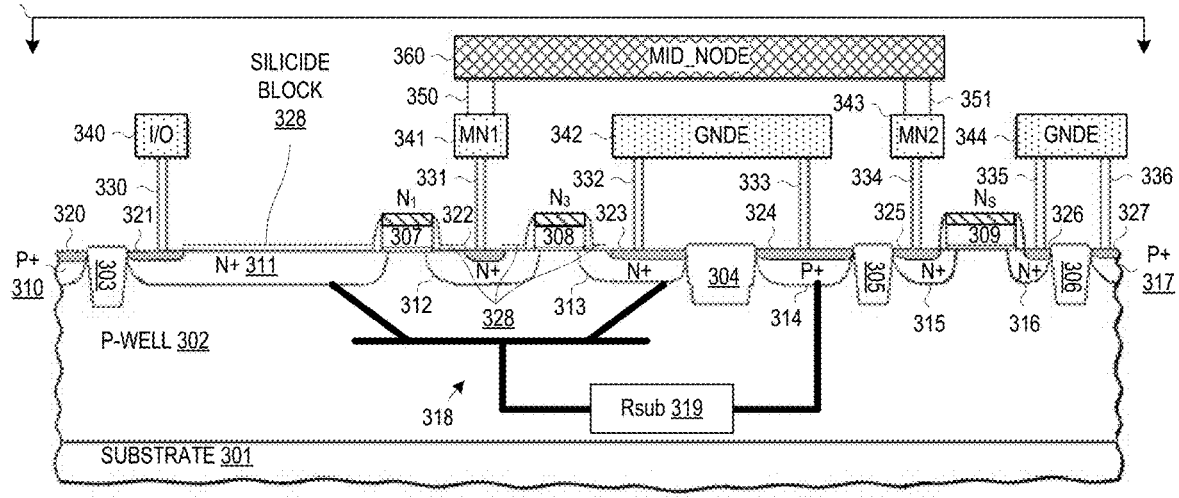
FIG. 3 shows a partial cross-sectional view of the NMOS-gated input/output driver in which a stacked, single diffusion ESD device provides an ESD current path from an I/O pin to a ground voltage over a common bipolar transistor in accordance with selected embodiments of the disclosure.

To provide additional details for an improved understanding of selected embodiments of the present disclosure, reference is now made to FIG. 3 which shows a partial cross-sectional view of the NMOS-gated input/output driver 300 in which a stacked, single diffusion ESD device N3 in the driver circuit provides an ESD current path from an I/O pin 340 to a ground voltage GNDE over a common bipolar transistor 318. For additional understanding, reference is also made to FIG. 4 which shows a circuit schematic representation 400 of the NMOS-gated input/output driver 300 of FIG. 3. The NMOS-gated input/output driver 300 is implemented as an integrated circuit formed with an n-type substrate 301 and a p-well 302, and includes an I/O pad conductor 340 connected in series with one or more driver transistors N1 and a current source transistor Ns, and which also includes an ESD bypass transistor N3 which is connected in parallel with the current source transistor Ns. Delineated by the peripheral isolation regions 303, 306, the NMOS-gated input/output driver 300 is formed over the p-well 302 with defined gate electrodes 307-309 and N+ source/drain regions and P+ substrate contacts 311-316 which are connected through via and metal interconnect layers 330-336, 340-344, 350-351, 360 to form the driver circuit 300. In particular, the I/O pad 340 is connected over via conductor 330 to a silicide contact region 321 in a first N+ drain region 311. Formed as a single diffusion region, the first N+ drain region 311 is shared with the first driver transistor N1 having a gate electrode 307 and adjacent second N+ source/drain region 312 formed in the p-well 302. Though not shown, it will be appreciated that additional driver transistors may be formed in a stacked arrangement with the first driver transistor N1.

The first driver transistor N1 is connected to drive the I/O pad 340 with current provided by a series-connected current source transistor Ns. In selected embodiments, the first driver transistor N1 is connected in series with the current source transistor Ns over shared conductor 360 (MID_NODE) using the metal interconnect and via conductors 331, 341, 350, 360, 351, 343, 334 which connect the silicide region 322 of the N+ source/drain region 312 to the silicide region 325 of the N+ drain region 315. In turn, the adjacent N+ source region 316 of the current source transistor Ns is connected over the silicide region 326 and via conductor 335 to the grounded voltage conductor 344 (GNDE) which is also connected to the p-well 302 over the via conductor 336, the silicide region 327, and P+ region 317. Though the current source transistor Ns is illustrated with reference to gate electrode 309 having N+ source/drain regions 315, 316 arranged in alignment with the first driver transistor N1, it will be appreciated that any suitable size, arrangement and configuration of the current source transistor Ns may be used. For example, the current source transistor Ns may have a gate electrode width that is perpendicular to the width dimension of the first driver transistor N1.

To protect the first driver transistor N1 against gate oxide breakdown voltages that can arise from ESD currents supplied to the I/O pad 340, the NMOS-gated input/output driver 300 also includes an ESD discharge transistor N3 connected in parallel with the current source transistor Ns. To this end, the N+ source/drain region 312 for the first driver transistor N1 is shared with the ESD discharge transistor N3 having a gate electrode 308 and adjacent N+ source region 313 formed in the p-well 302. With the N+ source region 313 connected over the silicide region 323 and via conductor 332 to the grounded voltage conductor 342 (GNDE), the ESD discharge transistor N3 is electrically connected in parallel with the current source transistor Ns. And with the grounded voltage conductor 342 (GNDE) also connected to the p-well 302 over the via conductor 333, the silicide region 324, and P+ region 314, the ESD discharge transistor N3 is connected to form an off-state transistor during normal operation, but to combine with the first driver transistor N1 during ESD events to form a common bipolar transistor 318 which connects the I/O pad to ground, thereby limiting drain-gate voltage at the first driver transistor N1 during ESD events.

As disclosed herein, the layout of the driver transistors and corresponding ESD bypass transistors should be constructed to create effective common bipolar transistors from I/O to ground for the NMOS-gated input/output driver 300 (or to supply for PMOS part). In selected embodiments, this is accomplished by making the widths of each ESD bypass transistor (e.g., N3) equal to the widths of the corresponding driver transistor (e.g., N1). In addition, silicide blocking extensions, alone or in combination with dedicated ESD implants, on the drain/source side of the driver transistors connected to the I/O pad may be included (as well as on ESD bypass transistors), if needed, to ensure that bipolar triggering can be survived, thereby building in voltage margins that will allow higher ESD performance. In FIG. 3, the depicted silicide blockage regions 328 (indicated with the dotted lines) are located in specified regions of the single diffusion N+ drain region 311 and N+ regions 312, 313 (namely, regions that are not proximate to the gate electrodes 307, 308 except where required for source/drain contacts) that do not include a silicide layer, though in some technologies, silicide blockage may not be required to survive triggering of the parasitic bipolar. As will be appreciated, specified regions of the N+ implant regions 311-313 may be formed without any silicide layers, such as by using mask elements (not shown) to define one or more drain-side resistor-protect-oxide (e.g., RPO, SBLK, etc.) regions in the substrate which are used to prevent the formation of silicide in these areas, thereby increasing their Ohmic resistance. The voltage margins can be also extended by adding series resistors in each branch of the transistor driver or that can be shared between both PMOS and NMOS transistor drivers, as illustrated in FIGS. 1-2 with the optional series resistance elements $R_{S1}$, $R_{S2}$.

Figure 5:
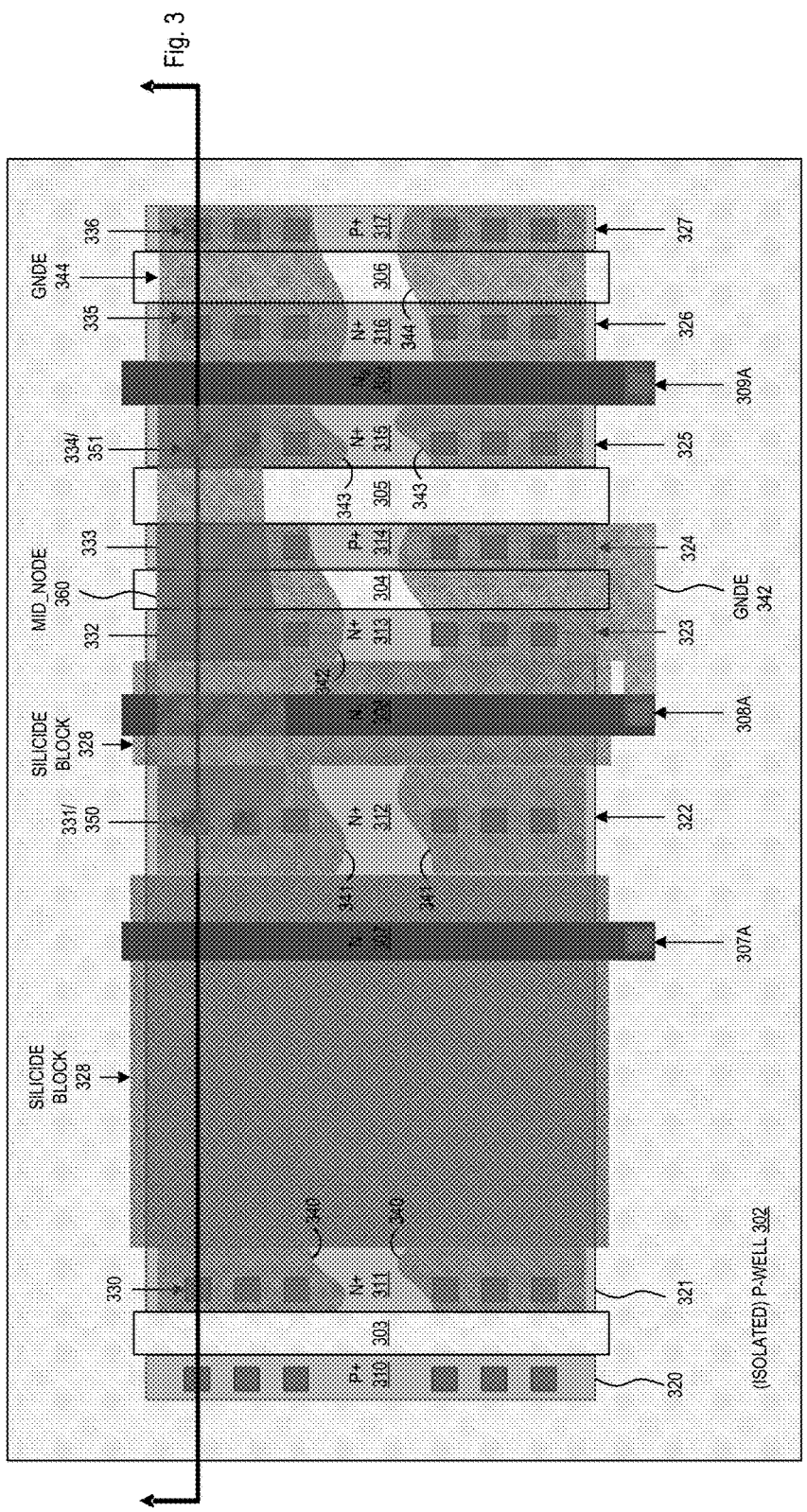
FIG. 5 shows a plan view of the NMOS-gated I/O driver of FIG. 3 in accordance with selected embodiments of the disclosure.

Turning now to FIG. 5, there is depicted a plan view 500 of the NMOS-gated I/O driver of FIG. 3 in accordance with selected embodiments of the disclosure. As depicted, the cross-sectional view of FIG. 3 is taken with reference to the perspective viewing line labeled "FIG. 3" shown in FIG. 5, and the plan view of FIG. 5 is taken with reference to the perspective viewing line labeled "FIG. 5" shown in FIG. 3. In particular, the plan view 500 shows the (isolated) p-well regions 302 are formed in the substrate to surround and contain the other circuit regions. As will be appreciated, the p-well 302 may be isolated from the substrate by an additional deep n-implant or deep n-well. In the p-well 302, the isolation regions 303-306 are formed to delineate the active regions. In the active regions of the p-well 302, gate electrodes 307-309 are defined and formed over the substrate, such as by depositing, patterning and etching a conductive layer (e.g., polysilicon) to form the gate electrodes 307-309. Using the gate electrodes 307-309 and selective implant masks, the N+ and P+ regions 310-317 are separately implanted or otherwise formed. In addition, silicide can be subsequently formed on the gate regions 307-309 (as indicated with the diagonal-hatched regions) and substrate regions 320-327 (as indicated with the gray-shaded regions) except for areas of the substrate where a silicide block 328 is located (as shown with dotted lines). In this way, a first driver transistor N1 is formed with a silicided gate electrode 307 and adjacent silicided N+ source/drain regions 311, 312, an ESD bypass transistor N3 is formed with a silicided gate electrode 308 and adjacent N+ source/drain regions 312, 313, and a current source transistor Ns is formed with a silicided gate electrode 309 and adjacent silicided N+ source/drain regions 315, 316. In addition, the placement of the ESD bypass transistor N3 and current source transistor Ns on opposite sides of the isolation regions 304, 306 and intervening P+ region 314 combine to create a parasitic bipolar transistor in the substrate which includes an a collector formed by the N+ drain region of the output driver transistor N1, a base formed by the P-type well or substrate region 302 and P+ region 314, and an emitter formed by the N+ source region of the ESD bypass transistor N3.

FIG. 5 also shows the metal interconnect layers formed over the p-well 302 to connect the transistors N1, N3, Ns to form an ESD-robust NMOS-gated input/output driver. In particular, the first driver transistor N1 and ESD bypass transistor N3 are connected in series between the I/O pad conductor 340 and a first ground (GNDE) conductor 342 such that the drain 311 of the first driver transistor N1 is connected via conductors 330 to the I/O pad conductor 340, and the source 313 of the ESD bypass transistor N3 is connected via conductors 332 to the first ground (GNDE) conductor 342. In addition, an upper (M2) metal layer 360 is defined to form a "mid-node" conductor (MID_NODE) which makes contact down through a first via conductor 341 formed in a lower (M1) metal layer to contact the shared, silicided N+ source/drain region 312/322. As formed, the "mid-node" conductor (MID_NODE) 360 may include one or more laterally extending fingers to extend over and past the first ground (GNDE) conductor 342 so as to make contact down through a second via conductor 343 formed in the lower (M1) metal layer to contact the silicided N+ drain region 315/325 of the current source transistor Ns.

With the source node of the current source transistor Ns connected by a second ground (GNDE) conductor 344, the current source transistor Ns and ESD bypass transistor N3 are connected in parallel between the shared MID_NODE and GND circuit nodes. And by connecting each of the first and second ground (GNDE) conductors 342, 344 to the P+ contact substrate regions 314, 317, the positioning and connection of the ESD bypass transistor N3 effectively creates an "off-state" transistor during normal operation, but during ESD events, the ESD bypass transistor effectively creates a parasitic bipolar transistor 318 which has a minimum possible distance between the collector and emitter nodes, thereby limiting drain-gate voltage at the first driver transistor N1.

In the layout implementation example shown in FIG. 5, it can be seen that the first driver transistor N1 and the ESD bypass transistor N3 are drawn to have the same widths. However, the current source transistor Ns does not need to have the same width as the first driver transistor N1, so it can have a much longer gate length or a different layout style. In fact, the provision of ESD protection benefits for the first driver transistor from adding an ESD bypass transistor N3 may be obtained without regard to the type of transistor device (or circuit) connected to the middle node (MID_NODE) of the stacked device, as the common bipolar transistor formed by the drain of the first driver transistor N1 and the source of the ESD bypass transistor N3 always limits the voltage at the middle node once the common bipolar device is activated.

Figure 4:
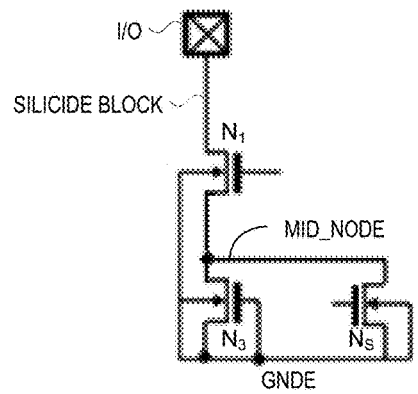
FIG. 4 shows a circuit schematic representation of the NMOS-gated input/output driver of FIG. 3.

In addition to forming an ESD-robust NMOS-gated input/output driver as shown in FIGS. 3-5, selected embodiments of the present invention may also be implemented to form an ESD-robust PMOS-gated input/output driver by forming PMOS transistors in an n-type substrate or well region, reversing the conductivity type of the diffusion regions, and replacing the GNDE or VSS supply voltage with the VDD supply voltage. In particular, it will be appreciated that a PMOS ESD bypass transistors (e.g., P3, P4) may be included in the I/O driver so as be connected in series with the I/O-facing PMOS driver transistors P1, P2, and in parallel with the PMOS current source transistor Ps (or any other circuit), with each PMOS ESD bypass transistor P3, P4 having a gate and source connected to the first power supply VDD and having a drain connected to share the source region of the I/O facing PMOS driver transistors P1, P2.

Figure 6:
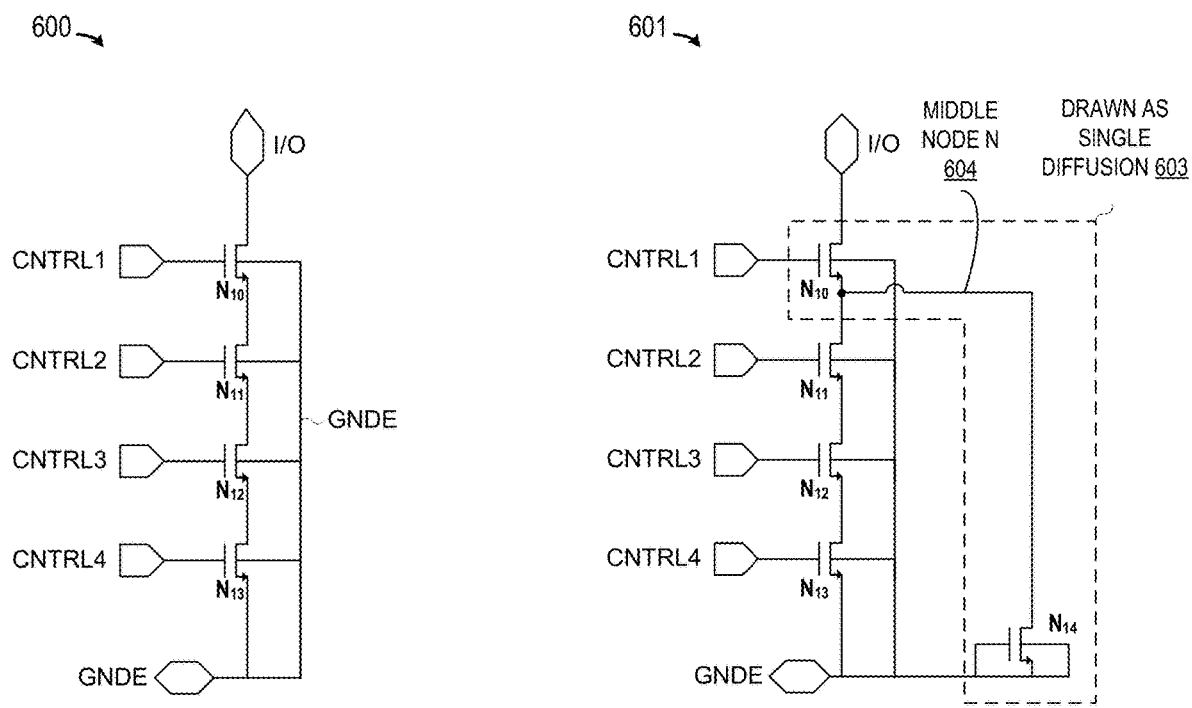
FIG. 6 illustrates a simplified circuit schematic diagram of a stacked output driver with and without the disclosed ESD bypass transistor for providing ESD protection in accordance with selected embodiments of the disclosure.

Regardless of whether implemented with PMOS or NMOS transistors, the addition of the ESD bypass transistor to form the ESD device as a combination with the I/O-facing driver transistor provides a normally-off transistor that can be activated by ESD events to absorb ESD current, thereby protecting not only the I/O-facing driver transistor, but also any additional driver transistors stacked below the I/O-facing driver transistor. To illustrate this benefit, reference is now made to FIG. 6 which provides a simplified circuit schematic diagram illustration of a stacked output driver circuit 600 which does not include the normally-off ESD device for comparison with a stacked output driver circuit 601 which does include a normally-off ESD device $N_{14}$ connected to a middle node N 604 to provide ESD protection. As illustrated, the stacked output driver circuit 600 includes a plurality of stacked NMOS transistors $N_{10}$-$N_{13}$ connected in series between the I/O pad and a supply voltage (e.g., GNDE), each controlled by a separate gate control signal (e.g., CNTRL1, CNTRL2, CNTRL3, CNTRL4). In the illustrated output driver circuit 600, there is an ESD risk during normal operation since an ESD event at the I/O pad can damage the gate oxide of the first or I/O-facing transistor $N_{10}$.

However, when an ESD event occurs with the stacked output driver circuit 601, the additional ESD bypass transistor ($N_{14}$) is "activated" to receive the ESD current over the middle node 604 as part of the parasitic bipolar junction transistor formed by the combination of the first I/O-facing driver transistor $N_{10}$ and the additional ESD bypass transistor $N_{14}$. By drawing the first I/O-facing driver transistor $N_{10}$ and additional ESD bypass transistor $N_{14}$ as a single diffusion device 603, the gate of the first I/O-facing driver transistor $N_{10}$ (and of the other NMOS transistors $N_{11}$-$N_{13}$) is protected by the voltage dropped on the (e.g., silicide blocked) drain of the first I/O-facing driver transistor $N_{10}$. Indeed, by designing the first I/O-facing driver transistor $N_{10}$ and the additional ESD bypass transistor $N_{14}$ to have a sufficient size to form a common bipolar junction transistor that is large enough to absorb the complete ESD current, the ESD diodes (e.g., A1, B1) in the ESD protection circuit may be redundant and not required for ESD protection.

As seen from the foregoing, if a circuit application requires multiple transistor devices to be connected in the stack, only the first transistor device in this stack must be made ESD robust by adding an extra off-state ESD bypass transistor device, alone or in combination with device silicide blockage (or any dedicated ESD implant)—if needed—to ensure that bipolar triggering can be survived. By providing the proper layout and connection of the extra off-state ESD bypass transistor device, ESD current will be contained within the newly formed common bipolar transistor to protect all the other devices connected below (or above in case of PMOS driver) the first I/O-facing transistor device.

By now it should be appreciated that there is provided herein an integrated driver circuit and method for providing the driver circuit with electrostatic discharge (ESD) protection. As disclosed, the integrated driver circuit includes an output driver transistor formed in a substrate region and electrically coupled between a circuit element (e.g., current source circuit) and a conductive pad. As formed, the output driver transistor includes a first MOSFET gate electrode coupled to receive a control signal, a source node coupled to the circuit element, and a drain node coupled to the conductive pad. In selected embodiments, the output driver transistor is a first PMOS transistor coupled over the circuit element to a VDD power supply conductor for driving current to the conductive pad, the ESD bypass transistor is a second PMOS transistor that is gate-source coupled to the VDD power supply conductor and that has a drain connected to the first PMOS transistor, and the circuit element is a third PMOS transistor coupled between the VDD power supply conductor and the source node of the output driver transistor. In other embodiments, the output driver transistor is a first NMOS transistor coupled over the circuit element to a VSS power supply conductor for driving current to the conductive pad, the ESD bypass transistor is a second NMOS transistor that is gate-source coupled to the VSS power supply conductor and that has a drain connected to the first NMOS transistor, and the circuit element is a third NMOS transistor coupled between the VSS power supply conductor and the source node of the output driver transistor. In selected embodiments, the output driver transistor comprises an ESD implant and/or silicide blockage. For example, the output driver transistor may include a partially silicided drain region defining a drain-side resistive element; an unsilicided drain region; an unsilicided drain region and unsilicided gate electrode; an unsilicided drain region and unsilicided source region; an unsilicided drain region, unsilicided source region, and unsilicided gate electrode; or a fully silicided drain region, source region, and gate electrode. In addition, the integrated driver circuit includes an ESD bypass transistor formed in the well or substrate region and electrically coupled in series with the output driver transistor between the power supply conductor and the source node of the output driver transistor. As formed, the ESD bypass transistor includes a second MOSFET gate electrode and a source node coupled directly or indirectly to the power supply conductor and a drain node coupled to the source node of the output driver transistor. For example, the gate node and/or source node of the ESD bypass transistor may be directly connected to the power supply conductor, or may be coupled over a pull-up/down device to the power supply conductor. The driver circuit also includes one or more conductive interconnect layers for connecting the ESD bypass transistor in parallel with the circuit element so that the ESD bypass transistor is in an off-state during normal operation and is activated to form a parasitic bipolar junction transistor with the output driver transistor to conduct ESD current between the power supply conductor and the conductive pad during ESD events. In selected embodiments, the first and second MOSFET gate electrodes of the output driver transistor and the ESD bypass transistor have the same width. As formed, the parasitic bipolar junction transistor includes a collector formed by a drain region of the output driver transistor having a first conductivity type, a base formed by the well or substrate region having a second, opposite conductivity type, and an emitter formed by a source region of the ESD bypass transistor having the first conductivity type. In selected embodiments, the ESD bypass transistor may include a partially silicided drain region defining a drain-side resistive element; an unsilicided drain region; an unsilicided drain region and unsilicided gate electrode; an unsilicided drain region and unsilicided source region; an unsilicided drain region, unsilicided source region, and unsilicided gate electrode; or a fully silicided drain region, source region, and gate electrode.

In another form, there is provided an integrated circuit (IC) device and method for making and operating same. The IC device includes a first conductor (e.g., pad conductor), a second conductor (e.g., power supply conductor), and a middle node conductor formed with one or more interconnect layers. The IC device also includes a driver transistor formed in a first substrate region and having a drain and source connected, respectively, to the first conductor and middle node conductor. In selected embodiments, the driver transistor may include a partially silicided drain region defining a drain-side resistive element; an unsilicided drain region; an unsilicided drain region and unsilicided gate electrode; an unsilicided drain region and unsilicided source region; an unsilicided drain region, unsilicided source region, and unsilicided gate electrode; or a fully silicided drain region, source region, and gate electrode. In addition, the IC device includes a circuit element formed in a second substrate region that is separated from the first substrate region by a middle substrate region, where the circuit element is connected between the middle node conductor and second conductor. In selected embodiments, the circuit element may be a current source transistor formed in the second substrate region and having a drain and source connected, respectively, to the middle node conductor and second conductor. Finally, the IC device includes a bypass transistor formed in the middle substrate region to be connected in parallel with the circuit element and connected in series with the driver transistor. As formed, the bypass transistor includes a drain connected directly with the source of the driver transistor and electrically connected to the middle node conductor; a source that is electrically connected to the second conductor; and a gate that is connected to the source node and that is directly or indirectly connected to the second conductor. With the disclosed arrangement of the IC device, conductive interconnect layers connect the drain of the bypass transistor and source of the driver transistor to the circuit element. In addition, the gate and source of the bypass transistor may, in selected embodiments, be connected over a pull-up/down device to the second conductor. As a result, the bypass transistor is not conductive during normal operation of the integrated circuit device and is activated during ESD events to form a parasitic bipolar junction transistor with the driver transistor to conduct ESD current between the first conductor and the second conductor during ESD events.

In yet another form, there is provided an ESD protected stacked driver circuit and process for making and operating same. The disclosed driver circuit is formed in a substrate having a doped region of a first conductivity type with a contact pad formed over the substrate, a stacked driver circuit, an ESD bypass transistor, and a circuit element which are connected by one or more interconnect structures. The stacked driver circuit includes a plurality of cascode-connected transistors having channels in the doped region, including at least a first output driver transistor formed in the doped region. The first output driver transistor includes a first gate electrode formed over a first channel in the doped region; a first diffusion region of a second conductivity type on one side of the first channel forming a drain that is electrically connected to the contact pad; and a second diffusion region of the second conductivity type on another side of the first channel forming a source that is electrically connected to a middle conductor node. The ESD bypass transistor is formed adjacent to the first output driver transistor in the doped region to be electrically connected in series between the first output driver transistor and a power supply. As formed, the ESD bypass transistor includes a second gate electrode formed over a second channel in the doped region; a drain on one side of the second channel formed from the second diffusion region of the first output driver transistor that is electrically connected to a middle conductor node; and a third diffusion region of the second conductivity type on another side of the second channel forming a source that is electrically connected to the second gate electrode and electrically coupled to the power supply. The circuit element is formed in the doped region and electrically connected between the middle conductor node and power supply. In selected embodiments, the circuit element is a current source transistor connected in parallel with the ESD bypass transistor. A first interconnect structure couples the second diffusion region to the middle conductor node, and a second interconnect structure couples the third diffusion region to the power supply and to a fourth diffusion region having the first conductivity type. In selected embodiments, a first silicide layer is formed over a portion of the first diffusion region spaced away from the first channel of the first output driver transistor. In other embodiments, a pull-up/down transistor device is connected between the second gate and the power supply. As a result, the ESD bypass transistor is not conductive during normal operation of the stacked driver circuit and forms a parasitic bipolar junction transistor with the first output driver transistor during ESD events to conduct ESD current between the contact pad and the power supply.

Although the described exemplary embodiments disclosed herein are directed to an ESD protection device and associated method of operation in which normally-off transistors are connected between the I/O-facing transistors and a reference voltage to form a single diffusion ESD device that creates a parasitic bipolar transistor during ESD events, the present invention is not necessarily limited to the example embodiments which illustrate inventive aspects of the present invention that are applicable to a wide variety of integrated ESD protection circuits. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Although the described exemplary embodiments disclosed herein focus on an LVDS output driver and method for driving an I/O pad with ESD protection, the present invention is not necessarily limited to the example embodiments illustrate herein and may be applied to protect any mixed signal I/O pad from ESD damage. For example, various embodiments of the system and design methodology disclosed herein may be implemented in connection with stacked power clamps, stacked drivers, cascoded drivers, or other I/O driver circuits to be protected against ESD events by inserting an ESD bypass transistor to protect a middle node of a first, I/O-facing stacked ESD transistor with a parasitic bipolar junction transistor. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

What is claimed is:

1. A driver circuit with electrostatic discharge (ESD) protection comprising:
   a power supply conductor;
   a conductive pad;
   an output driver transistor formed in a substrate or well region and electrically coupled between a circuit element and the conductive pad, the output driver transistor comprising a first MOSFET gate electrode coupled to receive a control signal, a source node coupled to the circuit element, and a drain node coupled to the conductive pad;
   an ESD bypass transistor formed in the substrate or well region and electrically coupled in series with the output driver transistor between the power supply conductor and the source node of the output driver transistor, the ESD bypass transistor comprising a second MOSFET gate electrode and a source node coupled directly or indirectly to the power supply conductor and a drain node coupled to the source node of the output driver transistor; and
   one or more conductive interconnect layers for connecting the ESD bypass transistor in parallel with the circuit element so that the ESD bypass transistor is in an off-state during normal operation and is activated to form a parasitic bipolar junction transistor with the output driver transistor to conduct ESD current between the power supply conductor and the conductive pad during ESD events.

2. The driver circuit of claim 1, where the output driver transistor comprises a first PMOS transistor coupled over the circuit element to a VDD power supply conductor for driving current to the conductive pad, and where the ESD bypass transistor comprises a second PMOS transistor that is gate-source coupled to the VDD power supply conductor and that is has a drain connected to the first PMOS transistor.

3. The driver circuit of claim 2, where the circuit element comprises a third PMOS transistor coupled between the VDD power supply conductor and the source node of the output driver transistor.

4. The driver circuit of claim 1, where the output driver transistor comprises a first NMOS transistor coupled over the circuit element to a VSS power supply conductor for driving current to the conductive pad, and where the ESD bypass transistor comprises a second NMOS transistor that is gate-source coupled to the VSS power supply conductor and that is has a drain connected to the first NMOS transistor.

5. The driver circuit of claim 4, where the circuit element comprises a third NMOS transistor coupled between the VSS power supply conductor and the source node of the output driver transistor.

6. The driver circuit of claim 1, where the output driver transistor comprises an ESD implant and/or silicide blockage.

7. The drive circuit of claim 1, wherein the first and second MOSFET gate electrodes have the same width.

8. The drive circuit of claim 1, wherein the parasitic bipolar junction transistor comprises a collector formed by a drain region of the output driver transistor having a first conductivity type, a base formed by the substrate or well region having a second, opposite conductivity type, and an emitter formed by a source region of the ESD bypass transistor having the first conductivity type.

9. The drive circuit of claim 1, where the ESD bypass transistor comprises an ESD implant and/or silicide blockage.

10. The drive circuit of claim 1, where the gate node of the ESD bypass transistor is coupled over a pull-up/down device to the power supply conductor.

11. An integrated circuit device comprising:
a first conductor;
a second conductor;
a middle node conductor;
a driver transistor formed in a first substrate region and having a drain and source connected, respectively, to the first conductor and middle node conductor;
a circuit element formed in a second substrate region that is separated from the first substrate region by a middle substrate region, the circuit element connected between the middle node conductor and second conductor; and
a bypass transistor formed in the middle substrate region to be connected in parallel with the circuit element and connected in series with the driver transistor, the bypass transistor comprising:
a drain connected directly with the source of the driver transistor and electrically connected to the middle node conductor,
a source that is electrically connected to the second conductor, and
a gate that is connected directly or indirectly to the second conductor;
wherein the bypass transistor is not conductive during normal operation of the integrated circuit device and is activated during ESD events to form a parasitic bipolar junction transistor with the driver transistor to conduct ESD current between the first conductor and the second conductor during ESD events.

12. The integrated circuit device of claim 11, where the first conductor comprises a pad conductor.

13. The integrated circuit device of claim 11, where the second conductor comprises a power supply conductor.

14. The integrated circuit device of claim 11, where the middle node conductor comprises one or more conductive interconnect layers for connecting the drain of the bypass transistor and source of the driver transistor to the circuit element.

15. The integrated circuit device of claim 11, where the circuit element comprises a current source transistor formed in the second substrate region and having a drain and source connected, respectively, to the middle node conductor and second conductor.

16. The integrated circuit device of claim 11, where the gate of the bypass transistor is connected over a pull-up/down device to the second conductor.

17. The integrated circuit device of claim 11, where the driver transistor comprises:
a partially silicided drain region defining a drain-side resistive element;
an unsilicided drain region;
an unsilicided drain region and unsilicided gate electrode;
an unsilicided drain region and unsilicided source region;
an unsilicided drain region, unsilicided source region, and unsilicided gate electrode; or
a fully silicided drain region, source region, and gate electrode.

18. An ESD protected stacked driver circuit, comprising:
a substrate;
a contact pad formed over the substrate;
a doped region having a first conductivity type in the substrate;
a stacked driver circuit comprising a plurality of cascode-connected transistors having channels in the doped region, the plurality of cascode-connected transistors comprising a first output driver transistor formed in the doped region, the first output driver transistor comprising:
a first gate electrode formed over a first channel in the doped region,
a first diffusion region of a second conductivity type on one side of the first channel forming a drain that is electrically connected to the contact pad, and
a second diffusion region of the second conductivity type on another side of the first channel forming a source that is electrically connected to a middle conductor node;
an ESD bypass transistor formed adjacent to the first output driver transistor in the doped region to be electrically connected in series between the first output driver transistor and a power supply, the ESD bypass transistor comprising:
a second gate electrode formed over a second channel in the doped region,
a drain on one side of the second channel formed from the second diffusion region of the first output driver transistor that is electrically connected to a middle conductor node, and a third diffusion region of the second conductivity type on another side of the second channel forming a source that is electrically connected to the second gate electrode and electrically coupled to the power supply;
a circuit element formed in the doped region and electrically connected between the middle conductor node and power supply;
a first interconnect structure coupling the second diffusion region to the middle conductor node; and
a second interconnect structure coupling the third diffusion region to the power supply and to a fourth diffusion region having the first conductivity type,
wherein the ESD bypass transistor is not conductive during normal operation of the stacked driver circuit and is activated during ESD events to form a parasitic bipolar junction transistor with the first output driver transistor to conduct ESD current between the contact pad and the power supply.

19. The ESD protected stacked driver circuit of claim 18, comprising a first silicide layer formed over a portion of the first diffusion region spaced away from the first channel of the first output driver transistor.

20. The ESD protected stacked driver circuit of claim 18, further comprising a pull-up/down device connected between the second gate and the power supply.

* * * * *